(12) United States Patent
Grilo

(10) Patent No.: US 7,009,452 B2
(45) Date of Patent: Mar. 7, 2006

(54) METHOD AND APPARATUS FOR INCREASING THE LINEARITY AND BANDWIDTH OF AN AMPLIFIER

(75) Inventor: Jorge Alberto Grilo, Mission Viejo, CA (US)

(73) Assignee: SolarFlare Communications, Inc., Irvine, CA (US)

( * ) Notice: Subject to any disclaimer, the term of this patent is extended or adjusted under 35 U.S.C. 154(b) by 22 days.

(21) Appl. No.: 10/688,005

(22) Filed: Oct. 16, 2003

(65) Prior Publication Data

US 2005/0083130 A1    Apr. 21, 2005

(51) Int. Cl.
*H03F 3/04* (2006.01)
(52) U.S. Cl. ...................................... 330/288; 323/315
(58) Field of Classification Search ................ 330/288, 330/264, 265, 269; 323/315, 316
See application file for complete search history.

(56) References Cited

U.S. PATENT DOCUMENTS

| 4,309,665 | A  | * | 1/1982 | Yamashiro    | ................... | 330/264 |
| 6,778,016 | B1 | * | 8/2004 | Luo          | ........................... | 330/288 |
| 6,842,075 | B1 | * | 1/2005 | Johnson et al. | ............. | 330/296 |

OTHER PUBLICATIONS

Huiting Chen, et al., "Current Mirror Circuit with Accurate Mirror Gate for Low β Transistors", 4 pages (Unknown Date).
G. Palmisano, et al., "Harmonic Distortion on Class AB CMOS Current Output Stages", *IEEE Transactions on Circuits and Systems-II: Analog and Digital Signal Processing,* vol. 45, No. 2, Feb. 1998, pp. 243-250.

* cited by examiner

*Primary Examiner*—Henry Choe
(74) *Attorney, Agent, or Firm*—Weide & Miller, Ltd.

(57) ABSTRACT

A method and apparatus is disclosed for improving high frequency performance of an amplifier, such as for example, a current mirror. In one embodiment, a delay element is introduced in a current mirror signal path to account for signal propagation delay that may exist in one or more alternative signal paths. The delay element maintains desired phase alignment at a cascade node of the current mirror thereby establishing, in one embodiment, the cascode node ($V_c$) in an AC ground state. To extend current mirror high frequency capability an embodiment is disclosed having cross-coupled capacitors, active elements, or one or more other devices configured to provide positive feedback to one or more current mirror inputs. The positive feedback may be selectively configured to increase the operational bandwidth of the current mirror.

13 Claims, 10 Drawing Sheets

METHOD AND APPARATUS FOR INCREASING THE LINEARITY AND BANDWIDTH OF AN AMPLIFIER

1. Field of the Invention

The invention relates to a method and apparatus for signal processing and in particular to a method and apparatus for improving the performance of a current mirror.

2. Related Art

Increases in data processing rates and transmit rates challenge the circuits responsible for processing and transmitting the data. This is particularly true in the field of data communication where the demand for higher processing and transmit rates continues to grow. FIG. 1 illustrates an example embodiment of a particular configuration of a current mirror circuit. As is understood, the current mirror 102 is a commonly utilized building block of a communication circuit. As shown, a current mirror input 104 is duplicated or mirrored at an output 108. As current mirrors 102 are widely utilized and generally know in the art, a detailed discussion of current mirror operation is not provided. Of importance however, the current mirror may be considered as having two paths $S_1$ and $S_2$ as shown.

When operation frequencies of current mirrors 102 increase (i.e. the signals passing through the current mirror), the current mirror performance may undesirably decrease due to inherent performance characteristics of the devices that make up the current mirror. By way of example, it can be seen that path $S_1$ passes through a first device 110 and a second device 112 while the signal progressing on path $S_2$ only passes through device 116. During desired operation signals progress through paths $S_1$ and $S_2$ to thereby create an AC ground at node $V_c$. This improves the linearity and matching around the operating point.

As a result of the propagation delays associated with the additional semiconductor of path $S_1$, the signal progressing along this path may take longer to arrive at the node 108. The delay may be caused by gate capacitance of the cascode device 112. This delay results in a phase mismatch between the signal arriving along path $S_1$ and the signal arriving along path $S_2$. This drawback becomes more pronounced as frequency increases and hence may become a roadblock to high speed operation. The phase mismatch causes the signals arriving via path $S_1$ and $S_2$ to no longer cancel. Consequently, $I_{in}$ does not match $I_{out}$ and a basic property of current mirror operation is lost. Moreover, the input signal will force the output impedance to vary while output linearity is also disrupted. This is a significant drawback to current mirror operation.

While various solutions have been proposed, no prior art solution overcomes this drawback. Fast in-band transitions in the input signal result in an un-cancelled drop in the drain-source voltage of the current mirror device which can drive the transistor into the linear region of operation, thus degrading the accuracy and linearity of the current mirror.

FIG. 2 illustrates a plot of current mirror transfer function of input to node $V_c$ of the current mirror over a range of exemplary frequencies. Frequency is represented along a horizontal axis 204 while signal magnitude is represented on the vertical axis 208. As shown, the current mirror input signal appearing at node $V_c$, shown by plot 212, is generally constant and substantially attenuated at low to mid frequencies. As frequency increases, however, it can be seen that the input signal can be seen at node $V_c$. This is a direct result of propagation delay preventing the signal on path $S_1$ from canceling the signal component arriving over path $S_2$. In some embodiments the change at high frequency can be orders of magnitude as compared to low frequency operation. This is highly undesirable. As a result there exists a need for a method and apparatus to enable high speed current mirror operation.

SUMMARY

Disclosed herein is a method and apparatus that overcomes the drawbacks of the prior art by enabling high frequency response for amplifiers, such as but not limited to current mirrors which may have a gain level greater than one, less than one, or a unity gain level. While one of ordinary skill in the art may devise configuration that differ from those described herein in one embodiment the invention comprises a high frequency current mirror configured to have a current mirror output, configured to provide an output signal from the current mirror, and a current mirror input. A first current mirror path is connected to the input and the output and a second current mirror path is connected to the input and the output. At least one semiconductor device is located in the first current mirror path and at least one semiconductor device is located in the second current mirror path. In this configuration the input is connected to positive feedback device configured to provide positive feedback to the input to thereby increase the bandwidth of a current mirror output signal provided at the output node of the current mirror.

In one embodiment at least one semiconductor device in the first current mirror path comprises a field effect transistor and the at least one semiconductor device in the second current mirror path comprises a field effect transistor. It is contemplated that the positive feedback device comprises cross-coupled capacitor. In one embodiment the current mirror further comprises a delay element in either of the first path or the second path and the delay element is configured to maintain an AC ground at the output. In one embodiment the delay element comprises a resistor-capacitor network. The capacitance of the resistor-capacitor network may be generated by a conductor trace.

In one embodiment a high frequency amplifier is provided and comprises an input configured to receive an input signal, and a junction configured to divide the input signal into a first signal on a first signal path and a second signal on a second signal path, wherein the first signal path comprises a lesser number of semiconductor junctions than the second signal path. Also part of this embodiment is an output node connected to both the first signal path and the second signal path such that the output node is configured to provide an output signal from the current mirror. In this embodiment or other embodiments a delay element is in the first path and is configured to delay the first signal to thereby maintain the first in opposite phase with the second signal at the output node which in turn may create an AC ground at the output node. It is further contemplated that a delay could be added to both paths. It is contemplated that a device other than a delay may be used such as an semiconductor device or any device configured to equalize the transfer functions of the two paths to establish cancellation.

In one embodiment the delay comprises a resistor-capacitor network. In another embodiment the delay comprises a resistor and the first path is configured to establish capacitance. It is contemplated that the input signal may be at a frequency of greater than 300 MHz. In one embodiment the current mirror comprises two or more current mirrors arranged as a differential current mirror. In one embodiment the amplifier further comprises one or more cross-coupled capacitors between the two or more current mirrors in the differential current mirror and the capacitors have capacitance values selected to extend the bandwidth of the differential current mirror. It is contemplated that the amplifier may further comprise at least one device configured to provide positive feedback to the current mirror to extend the bandwidth of the current mirror. The at least one device may comprise one or more capacitors.

Also disclosed herein is a method for extending the bandwidth of a differential amplifier comprising providing a differential amplifier having a first input node and a second input node and a first output node and a second output node, wherein the first input node and the first output node are associated with a first amplifier and the second input node and the second output node are associated with a second amplifier. The method may then establish a first capacitance that is cross-coupled between the first input node and the second output node and establish a second capacitance that is cross-coupled between the second input node and the first output node. The method may also provide a high frequency signal to the differential amplifier such that the cross-coupled first capacitance and the cross-coupled second capacitance extend the bandwidth of the differential amplifier.

In one embodiment the differential amplifiers comprise one or more differential configured current mirrors. In one embodiment the method further comprises providing at least one delay element configured to maintain an AC ground at a differential amplifier output. It is contemplated that the at least one delay element comprises a resistance and a capacitance. In one environment the high frequency signal comprises a signal at a frequency of greater than 350 MHz.

Another method for improving the high frequency operation of an amplifier is disclosed and comprises providing an amplifier having an at least one input and at least one output, wherein there exists two or more signal paths between the at least one input and the at least one output. This method connects a delay in at least one of the two or more signal paths such that the delay is configured to delay a signal passing through the at least one signal path to maintain an AC ground at the at least one output.

In one embodiment the delay comprises a semiconductor junction. In one configuration the amplifier comprises at least one current mirror. This method may further comprise connecting at least one element configured to provide positive feedback to the amplifier, the at least one element connected between the at least one input and the at least one output. In one embodiment the at least one element configured to provide positive feedback comprises at least one cross-coupled capacitor.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 3:
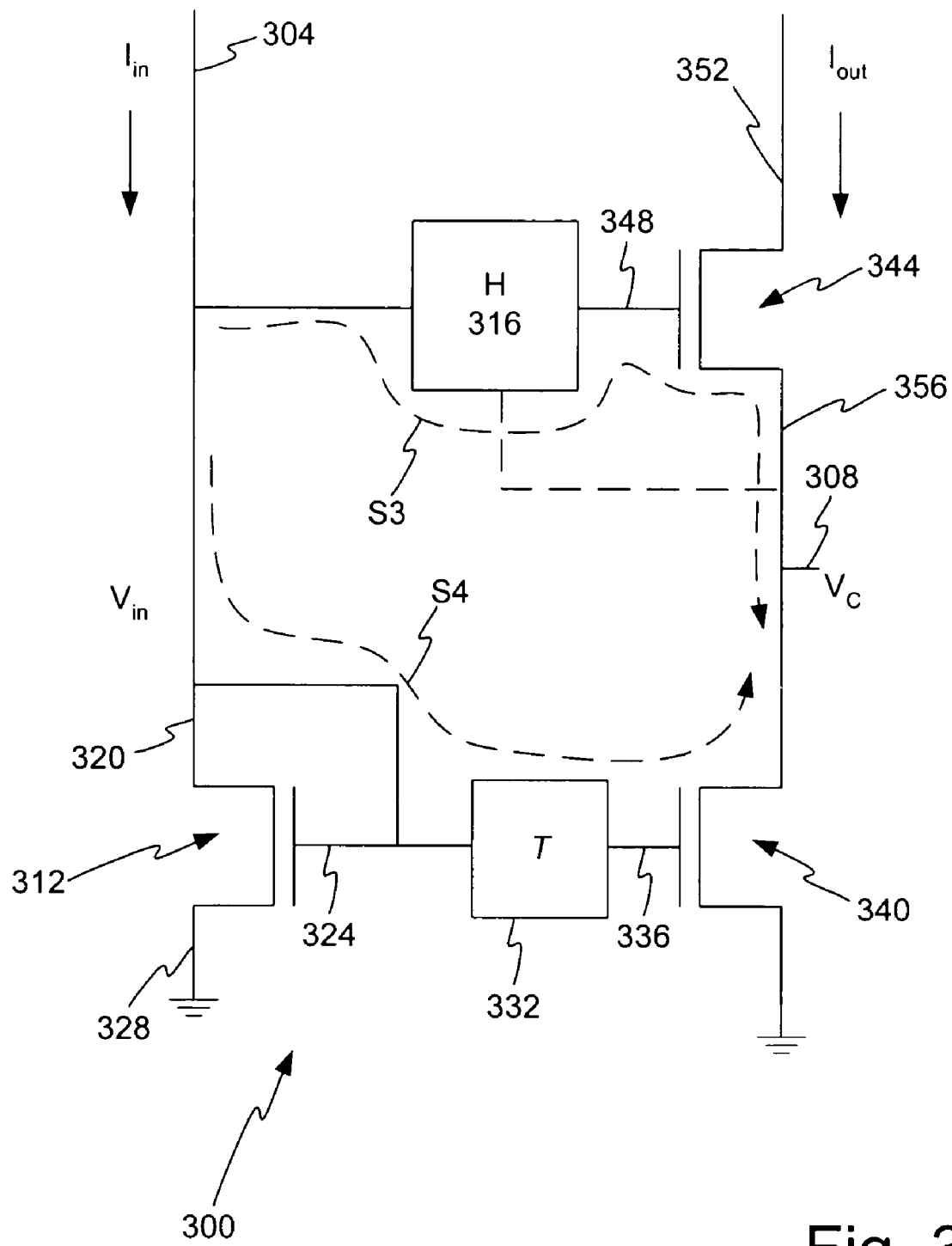
FIG. 3 illustrates an example embodiment of a current mirror having a delay element.

FIG. 3 illustrates an example embodiment of a current mirror 300 with a delay element 332. As shown a current mirror 300 having an input 304 provides an input signal to be mirrored or replicated at a current mirror output 352. The current mirror 300 may be configured to amplify the input signal by a factor N. The input 304 connects to a first semiconductor device 312 and second device 316. The second device 316 may comprise any type device configured to introduce a delay a signal or otherwise modify the signal phase or magnitude. In one embodiment the device 316 is configured with a low impedance for current input. In one embodiment the device 316 is configured to make $V_c$ equal to or generally equal to $V_{in}$. In one embodiment the device 316 is configured to create a virtual ground at $V_c$. The second device 316 may comprise, but is not limited to, a source follower, operational amplifier, amplifier, and transconductor amplifier.

In the example embodiment shown in FIG. 3, the first semiconductor device 312, comprises a N-type FET and the input 304 connects to the drain node 320 of the first device 312 which is in turn connected to the gate node 324. The source node 328 connects to ground as shown. Alternatively, either or both the devices 312, 340 may be connected to ground through resistors. This configuration is often referred to as source degeneration, which also addresses the improvement of accuracy and linearity. It is contemplated that all of these techniques or configuration can be combined in any combination.

The first device gate node 324 connects to a delay element 332 which in turn connects to a gate node 336 of a third device 340. The delay 332 is configured to delay or otherwise modify the signal passing from the gate 324 to the gate 336. The delay element 332 may comprise any type device or system that is capable of modifying the phase alignment or delaying the signal passing between gate node 324 and 336. For example, the element 332 may comprise a device other than a delay that is configured to phase adjust the signal passing there through or a device configured modify the phase and magnitude of the signal.

The output of device 316 connects to a fourth device 344 that in the embodiment shown in FIG. 3 comprises a transistor having a gate node 348, a drain node 352 and a source node 356. The second device 316 may optionally be connected to the $V_c$ node 308 as shown.

In operation, a portion of signal $I_{in}$, or another signal derived from $I_{in}$ such as for example a voltage, defined as S3, progresses through device 316 and device 344 to the node 308 while a portion of the signal $I_{in}$, defined as S4, passes through the path defined by device 340 and delay 332. The term node 308 and Vc are used interchangeable and the node 308 may also be referred to as a cascade node. As an advantage to the method and apparatus described herein the delay element 332 may be selected and/or controlled to control the time it takes for the signal S4 to arrive at output 308 to thereby maintain an AC ground at the node 308. This overcomes the drawbacks of prior art systems that did not utilize the delay element 332 because during high frequency operation the signal S3 passing through element 316 and element 344 encountered a greater propagation delay than the signal portion passing through only element 340 since the node 320 to node 324 connection does not introduce any delay. It is contemplated that the amount of delay introduced by element 332 may be controlled to establish the desired phase timing, and hence cancellation, at the node 308 of signal S3 and S4. This may thereby maintain an AC ground at output 308. In another embodiment the configuration is arranged to force $V_c$ to follow $V_{in}$.

Although in FIG. 3 the delay 332 is shown in the S4 signal path, i.e. through element 340, it is also contemplated that one or more delays may be placed at other locations within the circuit, such as for example a current mirror, to equalizing the signal propagation delays associated with one or more of the signal paths. This improves linearity, stabilizes output impedance, and generally improves system operation. This is particularly helpful for high frequency operation. Example high frequencies comprise 100 MHz to 500 MHz. Likewise, devices other than devices 312, 316, 340, and 344 may exist in the circuit to perform processing or other functions. Thus, the functionality gained by the delay element 332 is not limited to the particular circuit shown.

Stated another way, one or more elements 332 may be placed at various locations in the circuit shown in FIG. 3, or other amplifier or mirror circuits to adjust the transfer functions of signal paths within the circuit to maintain or establish a AC ground at node $V_c$. The changes in transfer functions of the paths may thus affect a signal's phase or magnitude, or both, or some other aspect of the signal. Resistors, capacitors, inductors, or a semiconductor device may be used.

Figure 4:
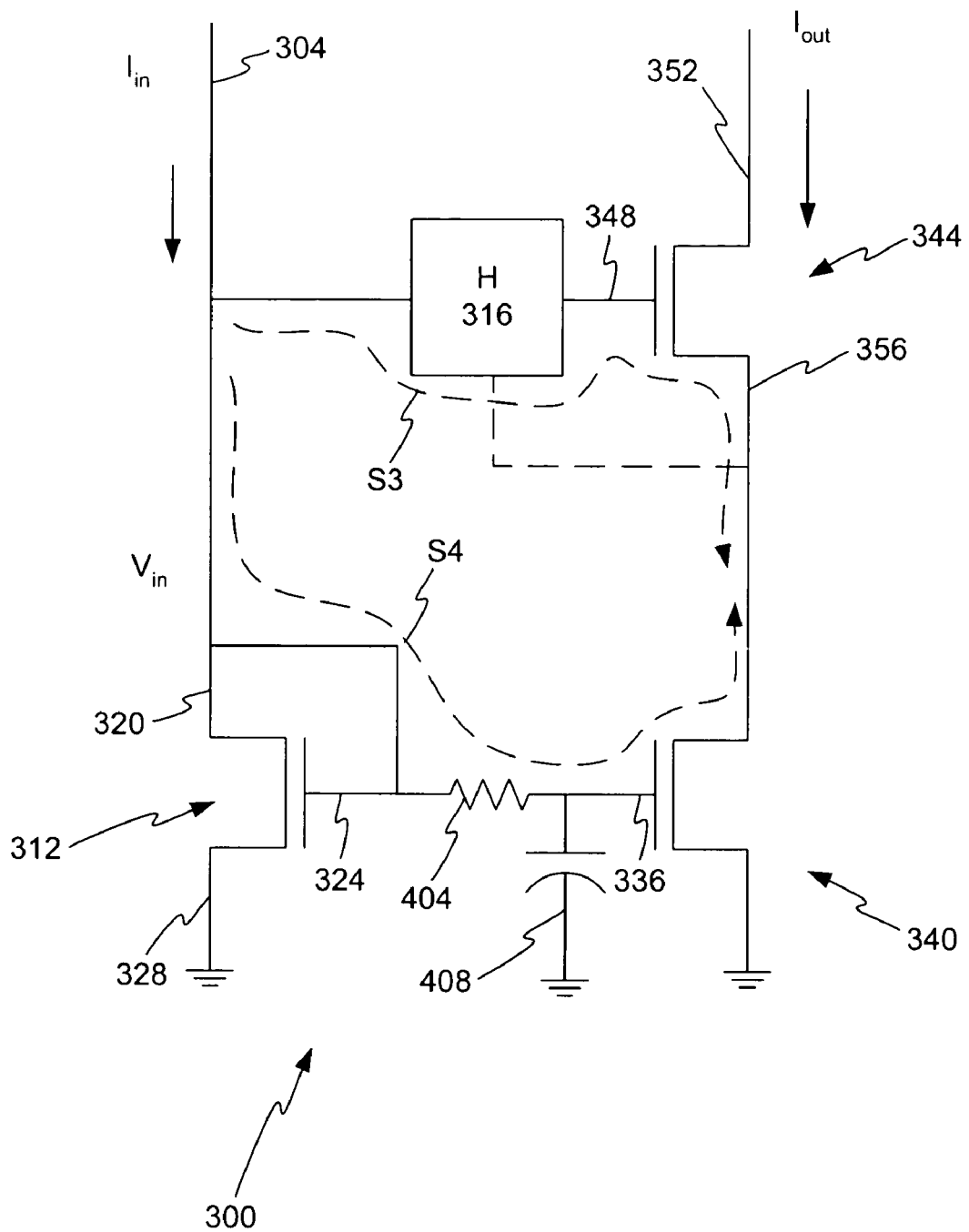
FIG. 4 illustrates an example implementation of a current mirror have delay element comprising an RC network.

FIG. 4 illustrates an example implementation of a current mirror have a delay element comprising an RC network. In comparison to FIG. 3, identical reference numerals are utilized to identify generally similar elements. In the embodiment shown in FIG. 4 the delay element 332 (FIG. 3) has been replaced with a resistor-capacitor network shown by elements 404 and 408. In particular, the gate node 324 connects to a resistor 404 which in turn connects to a capacitor 408 and the gate node 336. Capacitor 408 may comprise or represent a combination of gate capacitance from device 340 and an actual capacitor 408 if necessary.

In this example configuration the resistor-capacitor network introduces the desired delay to thereby equalize the delay as seen at output 308 between the path S3 and S4. The resistor value and the capacitor value may be selected to establish the desired amount of delay in the path S4.

Figure 1:
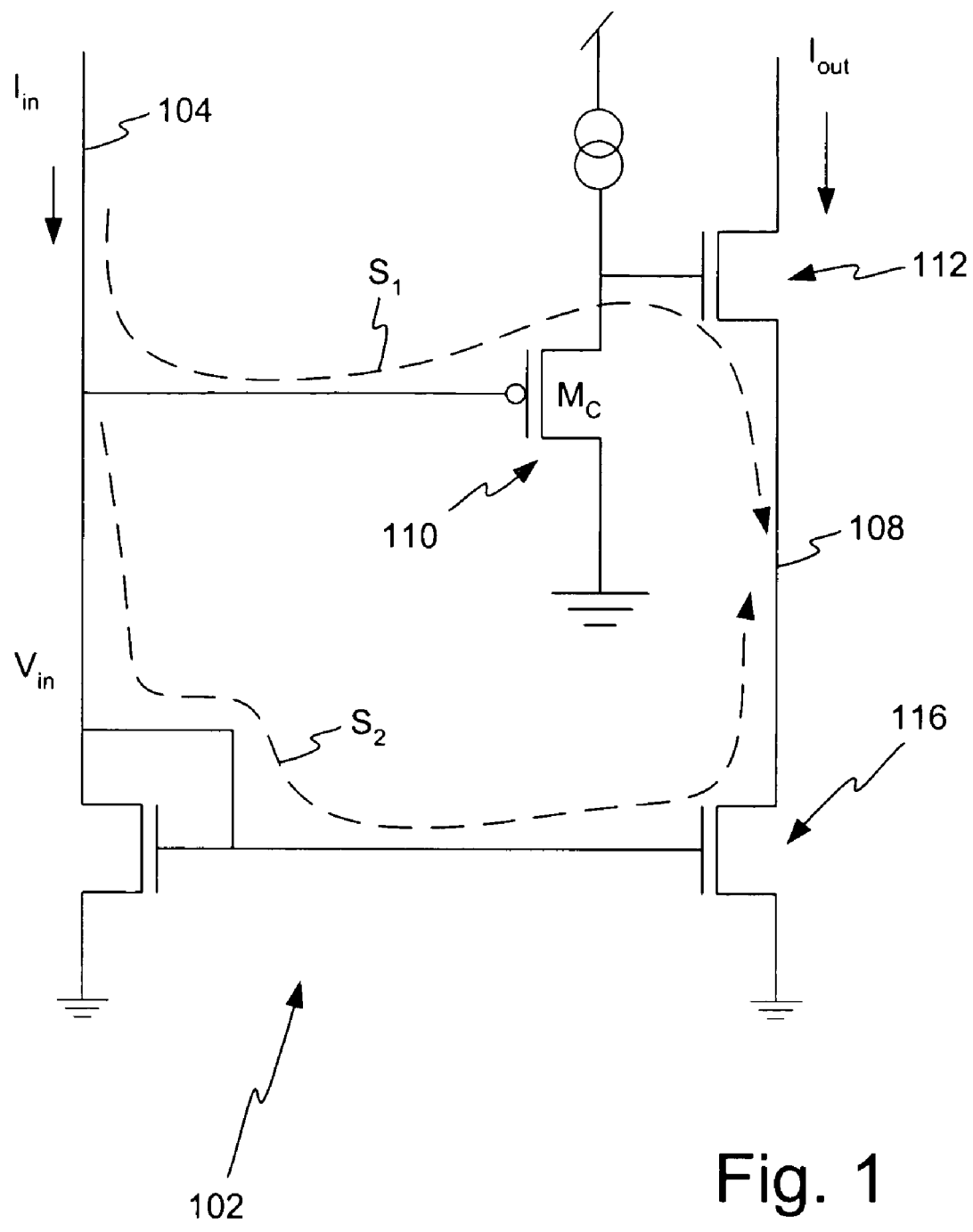
FIG. 1 is a circuit diagram of a prior art current mirror embodiment.
Figure 2:
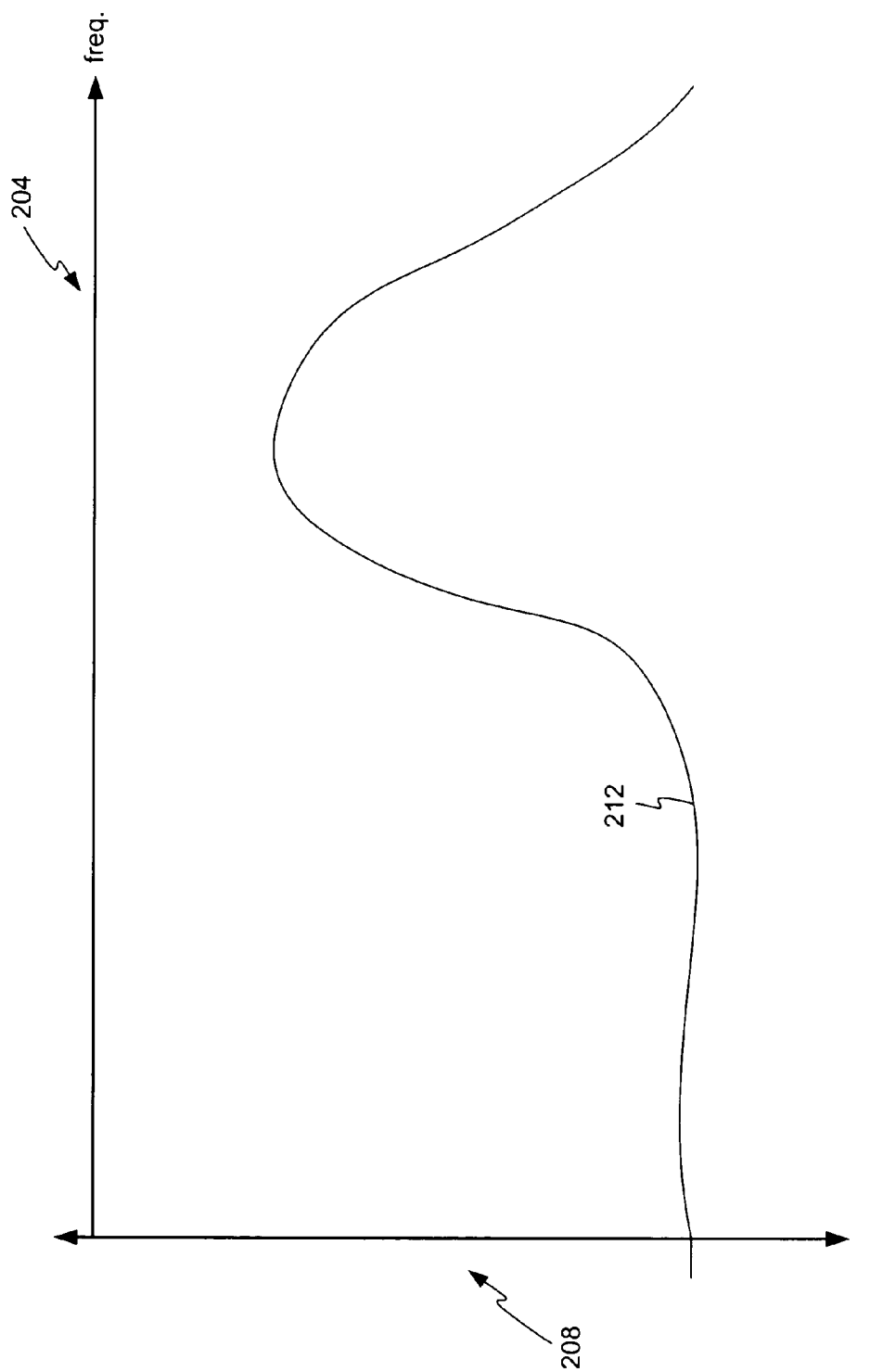
FIG. 2 is a signal plot of the transfer function for current mirror input to a current mirror node $V_c$.
Figure 5:
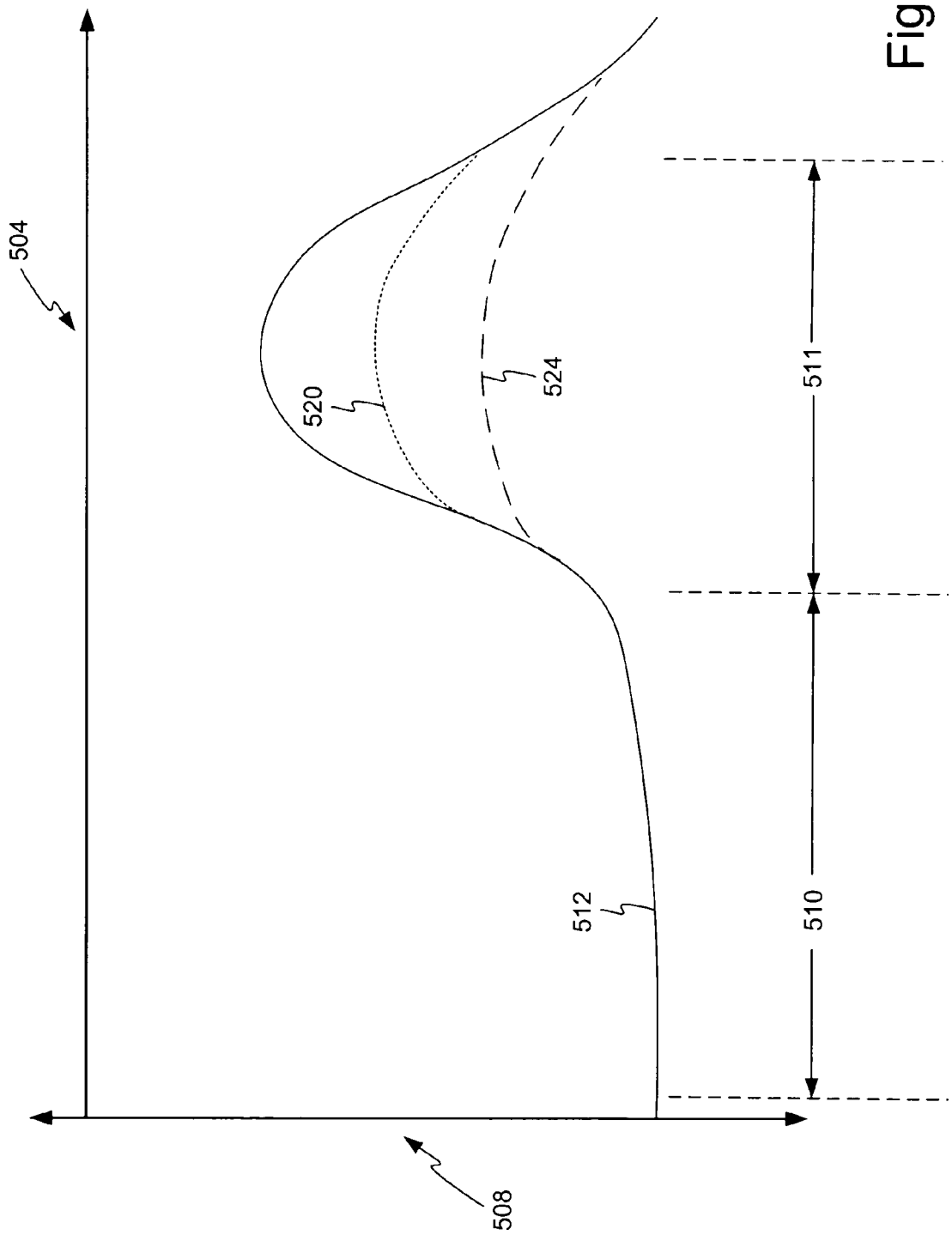
FIG. 5 illustrates a plot of current mirror transfer function of input terminal to node $V_c$ of a current mirror, equipped with a delay element, over a range of exemplary frequencies.

FIG. 5 illustrates a plot of a current mirror transfer function of the relation between input signal to node $V_c$ signal of a current mirror, equipped with varying amounts of delay from one or more delay elements, over a range of exemplary frequencies. Frequency is represented along a horizontal axis 504 while signal magnitude is represented on the vertical axis 508. As shown, the current mirror output signal appearing at node $V_c$, shown by region 510, is generally constant and substantially attenuated at low to mid frequencies. In contrast to the plot shown in FIG. 2, the delay balances the delay between signal paths $S_1$ and $S_2$ to maintain the AC ground at $V_c$ of the current mirror as the frequency increases. The relative lower value at low frequencies signifies very small gain or large attenuation. Thus, in regions 511, the plot 520 and the plot 524 illustrate respectively increasing amounts of delay in the signal path $S_2$. As can be seen, the delay on the second signal path reduces the signal appearing at the output node and hence as delay is provided or increased, an AC ground may be maintained at higher frequencies. Thus, at high frequencies, represented by region 511, the AC ground may be maintained at the output through the use of delay element.

As described above, the number of semiconductor junctions or devices through which a signal passes will effect the delay imposed on that signal and thus the delay associated with a path through a current mirror. By introducing one or more delay elements into a faster signal path then the phase alignment of the signals arriving at the output may be coordinated to generate an AC ground at the output node. This is shown in FIG. 5 in region 511 by signals plots 520 and 524.

As can be appreciated however, it may be undesirable to slow the response of the current mirror. By increasing the amount of delay in the current mirror signal paths the high frequency bandwidth of the circuit is reduced. Thus, although the AC ground is maintained, in some embodiments the bandwidth may be reduced. While at certain frequencies and in various embodiments this bandwidth reduction does not affect circuit operation, it may be unwanted in other configuration.

To address this issue, also disclosed herein is a method and apparatus for increasing the bandwidth of a circuit mirror configuration through the use of positive feedback at high frequencies or at desired frequencies. The positive feedback increases the quality factor of the system at high frequencies which in turn increases the bandwidth. In one embodiment positive feedback is utilized to extend or increase the bandwidth of a current mirror device.

Positive feedback may create complex conjugate poles and zeros. As the quality factor of the poles increases with increasing feedback, the frequency response of the circuit displays amplitude peaking near the signal band edge, thereby enhancing the bandwidth.

Determining the exact original location of the poles and zeros of the system is challenging because of numerous known and unknown parasitic sources of capacitance and other elements. Hence, simulation and possibly experimentation is often necessary to tailor the capacitance values to the particular needs the amplifier circuit. The amount of experimentation required is not undue experimentation. The amount of feedback required is dependant on the desired bandwidth of the current mirror or other circuit and hence the system configuration will depend on the particular needs of the system.

Figure 6:
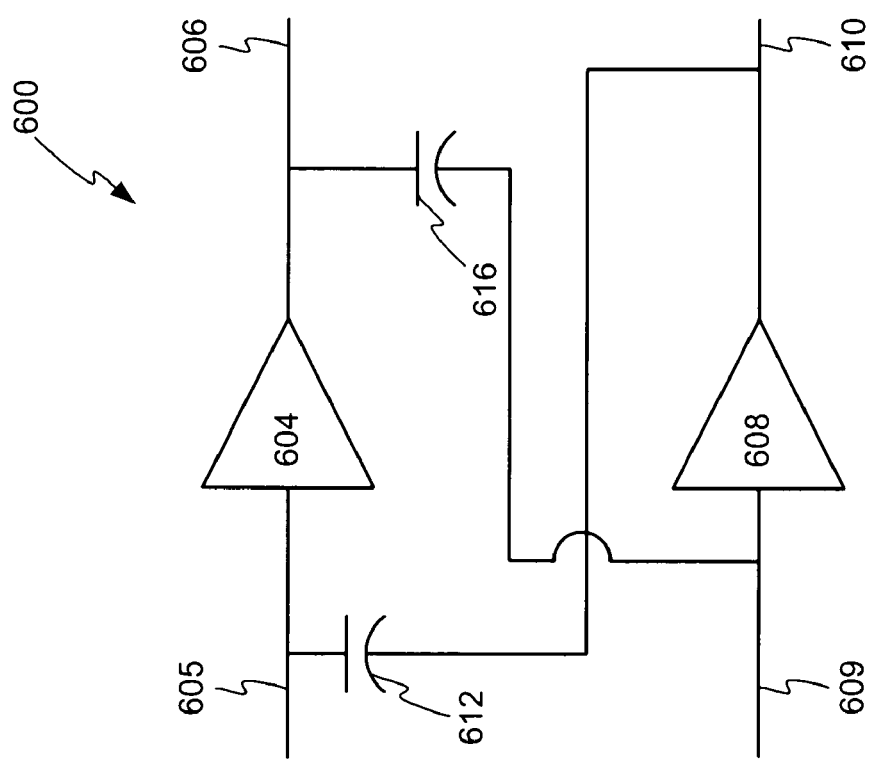
FIG. 6 illustrates an example embodiment of a cross-coupled amplifier configuration.

FIG. 6 illustrates an example of an embodiment of a cross-coupled amplifier configuration. As shown, a cross coupled amplifier system 600 comprises a first amplifier 604, having an input 605 and an output 606, is paired with a second amplifier 608, having an input 609 and an output 610. The first and second amplifiers 604, 608 are cross coupled with capacitors 612, 616 between inputs 605, 609 and outputs 606, 610 to establish positive feedback between amplifiers. This configuration extends the high frequency bandwidth of the amplifier pair. When the capacitor values increase the amount of feedback also increases and the bandwidth is likewise increased.

It is contemplated that devices other than capacitors may be utilized, such as but not limited to resistors, inductors, active devices, other passive devices. Likewise, other systems or arrangements may be arrived at that provide positive feedback to the input of one or more amplifiers systems to extend the bandwidth of one or more amplifiers without departing from the claims that follow. Moreover, the method of cross-coupling may be combined with the phase alignment techniques described above to achieve proper phase alignment in combination with the benefits of bandwidth extension.

Figure 7:
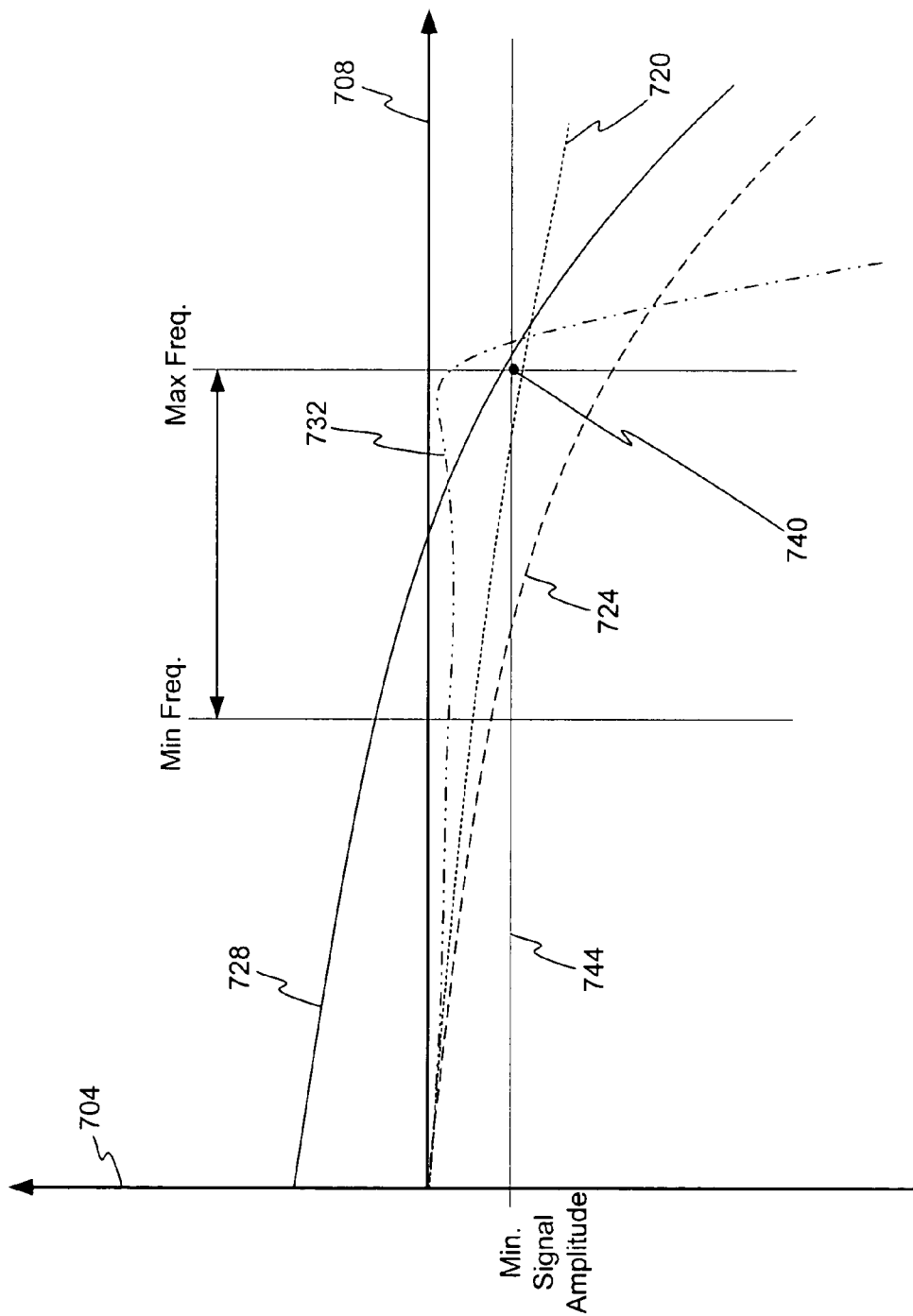
FIG. 7 illustrates numerous signal plots of signal amplitude versus frequency.

FIG. 7 illustrates numerous signal plots of signal amplitude versus frequency when positive cross-coupling is implemented in an amplifier device. The vertical axis 704 represents signal amplitude in dB while the horizontal axis 708 represents frequency. An operational frequency range is also shown as the frequency range between a min frequency and a max frequency. As can be seen in FIG. 7, as frequency increases the magnitude of the output signal decreases. When presented with high frequency signals, this drop in amplifier output magnitude can inhibit system operation. Plot 720 provides a reference plot that represents a plot of an amplifier output over a range of frequencies for a prior art amplifier system, such as a current mirror.

Plot 724 represents an output of an amplifier pair that was modified with an RC network or other delay element to improve phase matching at the outputs of the amplifier pairs. As can be seen, the bandwidth of the signal is reduced, although the phase alignment provides other benefits as discussed above.

Plot 728 illustrates an exemplary plot of an amplifier output in which the magnitude of the output signal is simply increased across the entire band of frequencies by increasing the amplification or input signal voltage level. As can be seen, this shifts the signal level upward in magnitude, thus increasing the effective bandwidth. While this is a possible solution, it suffers from the drawback of increasing power consumption over the entire band of frequencies, which in turn increases heat generation and may reduce system lifespan. In addition, the amplifier may be required to swing between greater voltage extremes and this tends to increase distortion, such as non-linearity.

Plot 732 illustrates an exemplary plot of an amplifier output in which the amplifier output receives positive feedback tailored to extend the bandwidth of the amplifier. As can bee seen, the output amplitude is more stable over a wider range of frequencies as compared to plots 724, 720, and 728. Of importance, at point 740, the maximum bandwidth point for the max frequency threshold, the amplitude of the signal plot 732 is above the minimum signal amplitude level 744 that is required for acceptable operation. This is a result of the positive feedback as disclosed herein. Signals represented by plots 720 and 724 do not meet this minimum requirement as the amplitude of these signals is below the minimum amplitude threshold at point 740.

It is contemplated that the method and apparatus for bandwidth enhancement may be applied to any amplifier or amplifiers to extend the usable bandwidth of the amplifier or boost the output amplitude at higher frequencies. As can be appreciated the bandwidth enhancement techniques primarily benefit operation at high frequencies. In one embodiment the frequencies at which this is particularly beneficial are frequencies above 300 MHz. In another embodiment the frequencies at which this is particularly beneficial are frequencies above 400 MHz. In another embodiment the frequencies at which this is particularly beneficial are frequencies above 500 MHz.

Figure 8A:
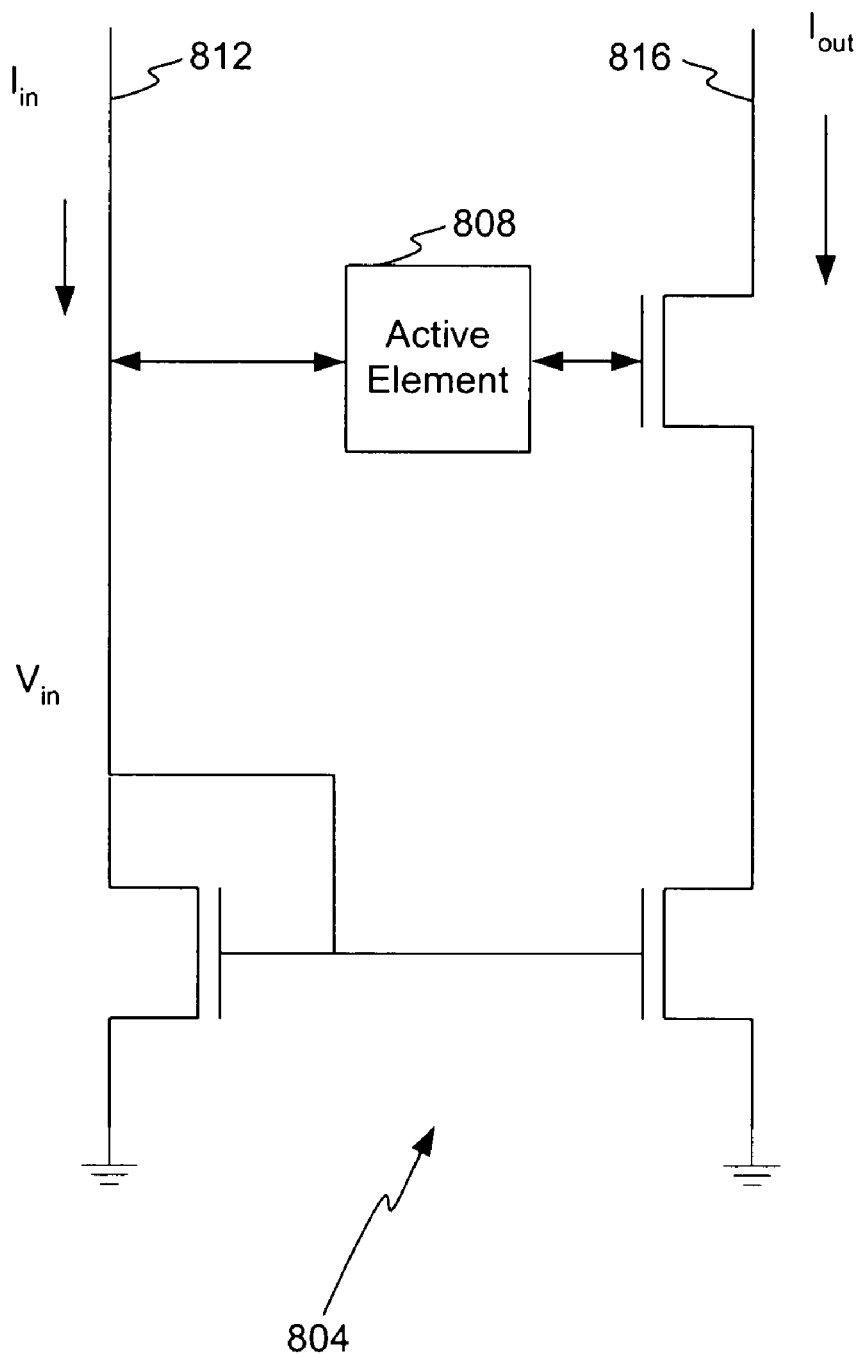
FIG. 8A illustrates an example embodiment of an amplifier configured with an active element.

FIG. 8A illustrates an example embodiment of an amplifier configured with an active element. As shown the current mirror configuration 804, which is discussed above, includes an active element 808 connected between the input node 812 of the current mirror and the output path 816. In this manner the active element may provide positive feedback to either or both of the input node 812 and the output path 816. In addition, it is contemplated that some form of control structure may be provided to determine the amount of active feedback that is necessary to achieved the desired bandwidth.

In one method of operation the active element 808 provides a signal to the inputs 812, 816 to thereby improve the high frequency response. It is contemplated that any type active device 808 may be utilized to achieve the goals as set forth herein. In one embodiment the active element adjusts the delay associated with one or more signal paths within the current mirror.

Figure 8B:
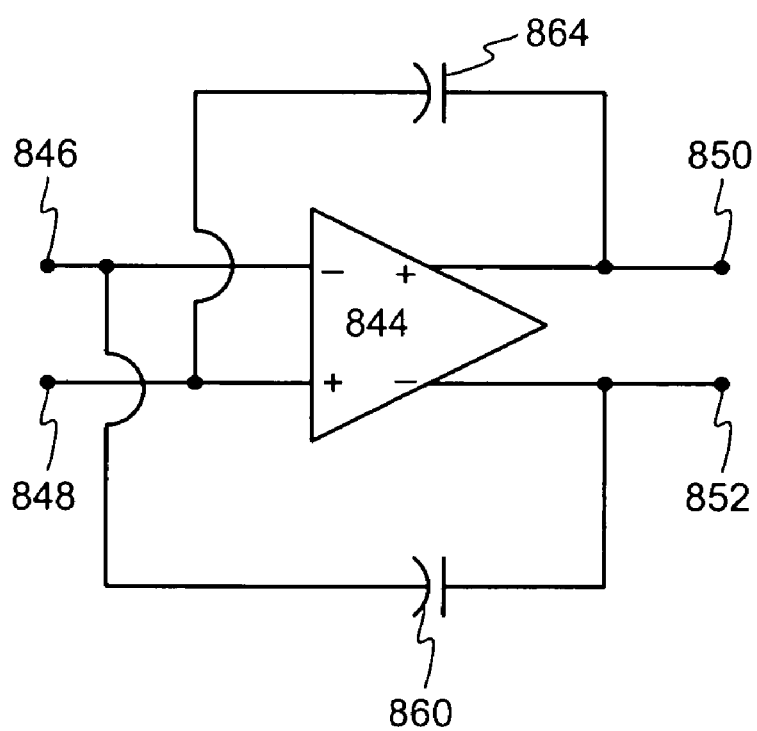
FIG. 8B illustrates an example embodiment of an amplifier configured with positive feedback.

FIG. 8B illustrates an embodiment having a differential amplifier having cross-coupled capacitors linking adjacent input and output terminals. The amplifier 844 has a first input 846, a second input 848, a first output 850 and a second output 852. Cross connected between the input 846 and the output 852 is a capacitor 860 while cross connected between the input 848 and the output 850 is a capacitor 864. The capacitor values are selected to provide an amount of positive feedback to extend the bandwidth of the amplifier 844. As shown in FIG. 8B, the connections and polarity associated therewith establish the desired positive feedback. It should be further noted that although the particular embodiment of FIG. 8B suggests a shunt-shunt type of feedback, the figure is merely for discussion and clarification. The concept applies and extends to any other type of feedback, as may be arrived at by one of ordinary skill in the art after reading this description and the claims that follow.

Figure 9:
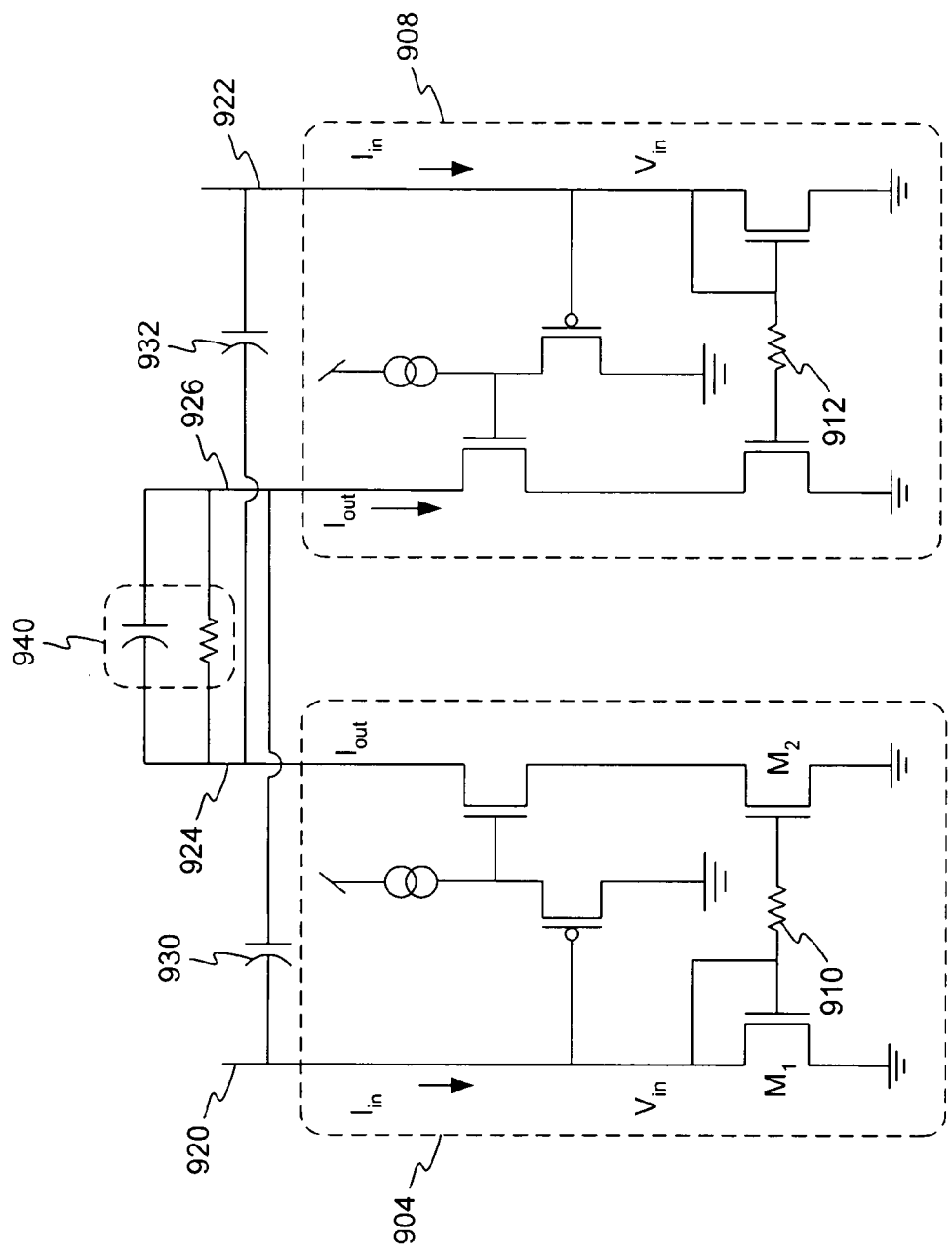
FIG. 9 illustrates a circuit diagram of an example implementation of a differential implementation employing a delay element and positive feedback.

FIG. 9 illustrates a circuit diagram of an example implementation of a differential amplifier implementation employing a delay element and positive feedback. As aspects of the system shown in FIG. 9 have been discussed above, only portions of FIG. 9 are discussed. As shown a first current mirror 904 and a second current mirror 908 are configured in a differential configuration. The first and second current mirrors 904, 908 are equipped with delay elements comprising in this embodiment resistors 910, 912. It is contemplated that devices other than resistors may be utilized to implement a delay. It is also contemplated that capacitances may be introduced, although not shown in this embodiment, as part of a delay element and that the capacitance may result as part of the conductor trace or as part of the current mirror design. Thus in one embodiment the capacitance may be generated by the trace design or the configuration of the trace, or the gate capacitance of a semiconductor device. In one embodiment the dominating component is the gate parasitic capacitance especially if the value for N, the amplification level, is large.

This capacitance, in combination with the positive feedback, may be sufficient to maintain phase cancellation. Thus, the capacitance that may be associated with the resistors 910, 912 may be gained as part of system configuration or implemented as separate elements as is shown in FIG. 4. An exemplary AC load 940 is also shown.

Connected between the inputs nodes 920, 922 and the output nodes 924, 926 of the current mirrors 904, 908 are cross-connected capacitors 930, 932. The cross-connected capacitors 930, 932 provide positive feedback between the differential current mirrors 904, 908 to thereby extend the bandwidth of the differential current mirror. It is contemplated that devices, systems, or configurations other than cross-connected capacitors may be utilized to establish positive feedback.

Utilizing one method of estimating or determining the capacitor values, the non-dominating parasitic effects can be ignored and poles of the original circuit would be read and determined by the output load, such as for example $-1/R_L C_L$, and by the transconductance of the input device M1 and the total capacitance at that node, including the gates of M1 and M2, i.e. $gm_1/C_{in}$. Adding resistor 910 or 912 will make the latter pole move to lower frequencies thereby reducing the circuit bandwidth, which is shown by:

$$\frac{-g_{m_1}}{[C_{in}(1 + g_{m_1} R)]}$$

Adding the feedback capacitors can make the poles complex conjugate. If too much feedback is applied, the poles eventually move to the right-half plane and the circuit becomes unstable. How much feedback is necessary thus depends on the particular design and magnitude of the parasitic elements, and can be determined through simulation or approximation, such as with advanced symbolic analysis tools.

Thus, the combination of the delay and the positive feedback results in a more accurate and linear current mirror that also exhibits better performance at higher frequencies without increasing current consumption.

While various embodiments of the invention have been described, it will be apparent to those of ordinary skill in the art that many more embodiments and implementations are possible that are within the scope of this invention. For example it is contemplated that implementations may occur in bipolar, BiCMOS, or any other technology now in existence or developed in the future.

What is claimed is:

1. A high frequency current mirror comprising:
    a current mirror having an input node, a cascode node, and an output node configured to provide an output signal from the current mirror;
    a first current mirror path between the input node and the cascode node;
    a second current mirror path between the input node and the cascode node;
    at least one semiconductor device in the first current mirror path; and
    at least one semiconductor device in the second current mirror path;
    a device configured to modify the transfer function of either of the first path or the second path to thereby increase the bandwidth of a current mirror by maintaining an AC ground at the cascode node.

2. The current mirror of claim 1, wherein the at least one semiconductor device in the first current mirror path comprises a field effect transistor and at least one semiconductor device in the second current mirror path comprises at a field effect transistor.

3. The current mirror of claim 1, wherein the device comprises delay element.

4. The current mirror of claim 1, further comprising a device in both the first current mirror path or the second current mirror path configured to maintain an AC ground at the output.

5. The current mirror of claim 3, wherein the delay element comprises a resistor-capacitor network.

6. The current mirror of claim 5, wherein the capacitance of the resistor-capacitor network is generated by a conductor trace, a semiconductor device input capacitance, or both.

7. A high frequency amplifier comprising:
    an input configured to receive an input signal;
    a node configured to divide the input signal into a first signal on a first signal path and a second signal on a second signal path, wherein the first signal path comprises a lesser number of semiconductor junctions than the second signal path;
    a $V_c$ node connected to both the first signal path and the second signal path; and
    a device in the first path configured to delay the first signal to thereby maintain the first signal out of phase with the second signal at the $V_c$ node to thereby create an AC ground at the $V_c$ node.

8. The amplifier of claim 7, wherein the delay comprises a resistor-capacitor network.

9. The amplifier of claim 7, wherein the delay comprises a resistor and the first path is configured to establish capacitance.

10. The amplifier of claim 7, wherein the input signal is at a frequency of greater than 300 MHz.

11. A method for improving high frequency operation of an amplifier comprising:
    providing an amplifier having an at least one input, at least one cascode node, and at least one output, wherein there exists two or more signal paths between the at least one input and the at least one cascode node; and
    connecting a delay in at least one of the two or more signal paths, the delay configured to modify the transfer function of a signal passing through the at least one signal path to maintain an AC ground at at least one of the cascode nodes.

12. The method of claim 11, wherein the delay comprises a semiconductor device.

13. The method of claim 11, wherein the amplifier comprises at least one current mirror.

* * * * *